United States Patent
Dhillon et al.

(10) Patent No.: US 10,886,698 B2
(45) Date of Patent: Jan. 5, 2021

(54) LASER SOURCE AND METHOD OF MANUFACTURING SUCH

(71) Applicants: CENTRE NATIONAL DE LA RECHERCHE SCIENTIFIQUE, Paris (FR); UNIVERSITE PARIS DIDEROT—PARIS 7, Paris (FR); SORBONNE UNIVERSITE, Paris (FR); ECOLE NORMALE SUPERIEURE, Paris (FR)

(72) Inventors: Sukhdeep Dhillon, Bourg la Reine (FR); Hanond Nong, Evry (FR); Feihu Wang, Villebon sur Yvette (FR); Tobias Fobbe, Iserlohn (DE); Nathan Jukam, Bochum (DE)

(73) Assignees: CENTRE NATIONAL DE LA RECHERCHE SCIENTIFIQUE, Paris (FR); SORBONNE UNIVERSITÉ, Paris (FR); UNIVERSITE PARIS DIDEROT—PARIS 7, Paris (FR); ECOLE NORMALE SUPERIEURE, Paris (FR)

(*) Notice: Subject to any disclaimer, the term of this patent is extended or adjusted under 35 U.S.C. 154(b) by 0 days.

(21) Appl. No.: 16/342,173

(22) PCT Filed: May 5, 2017

(86) PCT No.: PCT/IB2017/000763
§ 371 (c)(1),
(2) Date: Apr. 15, 2019

(87) PCT Pub. No.: WO2018/073634
PCT Pub. Date: Apr. 26, 2018

(65) Prior Publication Data
US 2019/0252853 A1   Aug. 15, 2019

Related U.S. Application Data

(60) Provisional application No. 62/409,051, filed on Oct. 17, 2016.

(51) Int. Cl.
H01S 5/0625   (2006.01)
H01S 5/065    (2006.01)
(Continued)

(52) U.S. Cl.
CPC .......... H01S 5/0625 (2013.01); H01S 5/0657 (2013.01); H01S 5/1021 (2013.01);
(Continued)

(58) Field of Classification Search
CPC ........ H01S 5/0657; H01S 5/1021; H01S 5/14; H01S 5/1025; H01S 5/3402; H01S 5/0625; H01S 5/142; H01S 2302/02
(Continued)

(56) References Cited

U.S. PATENT DOCUMENTS

| | | | | |
|---|---|---|---|---|
| 6,215,805 B1 * | 4/2001 | Sartorius | ............... | H01S 5/0625 372/10 |
| 7,447,246 B2 * | 11/2008 | He | ......... | H01S 5/0265 372/10 |
| 8,306,433 B2 * | 11/2012 | Kakitsuka | ........... | H01S 5/06256 398/183 |

OTHER PUBLICATIONS

Kafaka, et al., "Picosencond and femtosecond pulse generation in a regeneratively mode locked Ti:sapphire laser", IEEE J.Quatum Electron, vol. 28, No. 10, pp. 2151-2162,1992.
(Continued)

*Primary Examiner* — Tuan N Nguyen
(74) *Attorney, Agent, or Firm* — BakerHostetler

(57) ABSTRACT

A laser source for emitting radiation in a given emission spectral band, centered on a given emission angular frequency, the central emission angular frequency is provided.
(Continued)

The laser source comprises a laser cavity comprising a gain section having a known frequency dependent Group Delay Dispersion, and a GTI mirror arranged at one end of the gain section, having a known frequency dependent Group Delay Dispersion. The gain section and the GTI mirror are formed into a same laser medium, the laser medium having a known frequency dependent Group Delay Dispersion, and the gain section and the GTI mirror are separated by a gap of predetermined width filled with a dielectric medium thus forming a two parts laser cavity. Further, the GTI GDD at least partly compensates the sum of the Gain GDD and the material GDD in the emission spectral band.

11 Claims, 8 Drawing Sheets

(51) Int. Cl.
    *H01S 5/10*   (2006.01)
    *H01S 5/34*   (2006.01)
    *H01S 5/14*   (2006.01)
    *H01S 5/22*   (2006.01)

(52) U.S. Cl.
     CPC ............. *H01S 5/14* (2013.01); *H01S 5/142* (2013.01); *H01S 5/3402* (2013.01); *H01S 5/1025* (2013.01); *H01S 5/22* (2013.01); *H01S 2302/02* (2013.01)

(58) Field of Classification Search
     USPC ............................................... 372/4
     See application file for complete search history.

(56) References Cited

OTHER PUBLICATIONS

Villares, et al., "Dispersion engineering of quantum cascade laser frequency combs", Optica, vol. 3, No. 3, p. 252 (2016).

Szipöcs, et al., "Negative dispersion mirrors for dispersion control in femtosecond lasers: chirped dielectric mirrors and multi-cavity Gires-Tournois interferometers", Applied Physics B, vol. 70, Supplement 1, pp. S51-S57, May 24, 2000.

* cited by examiner

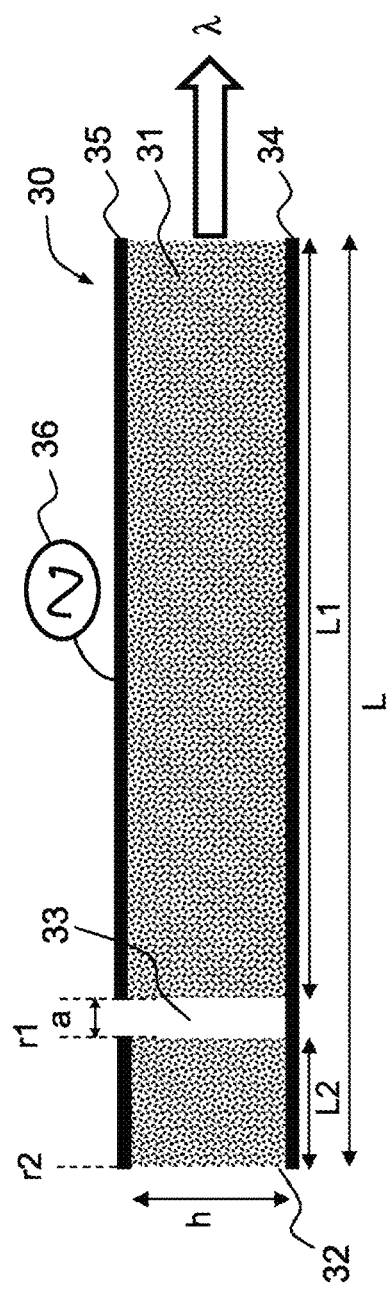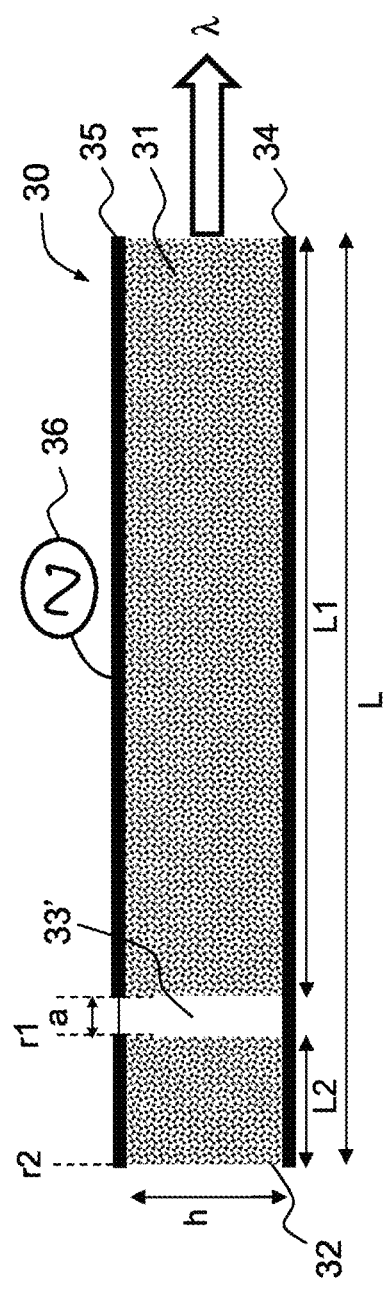

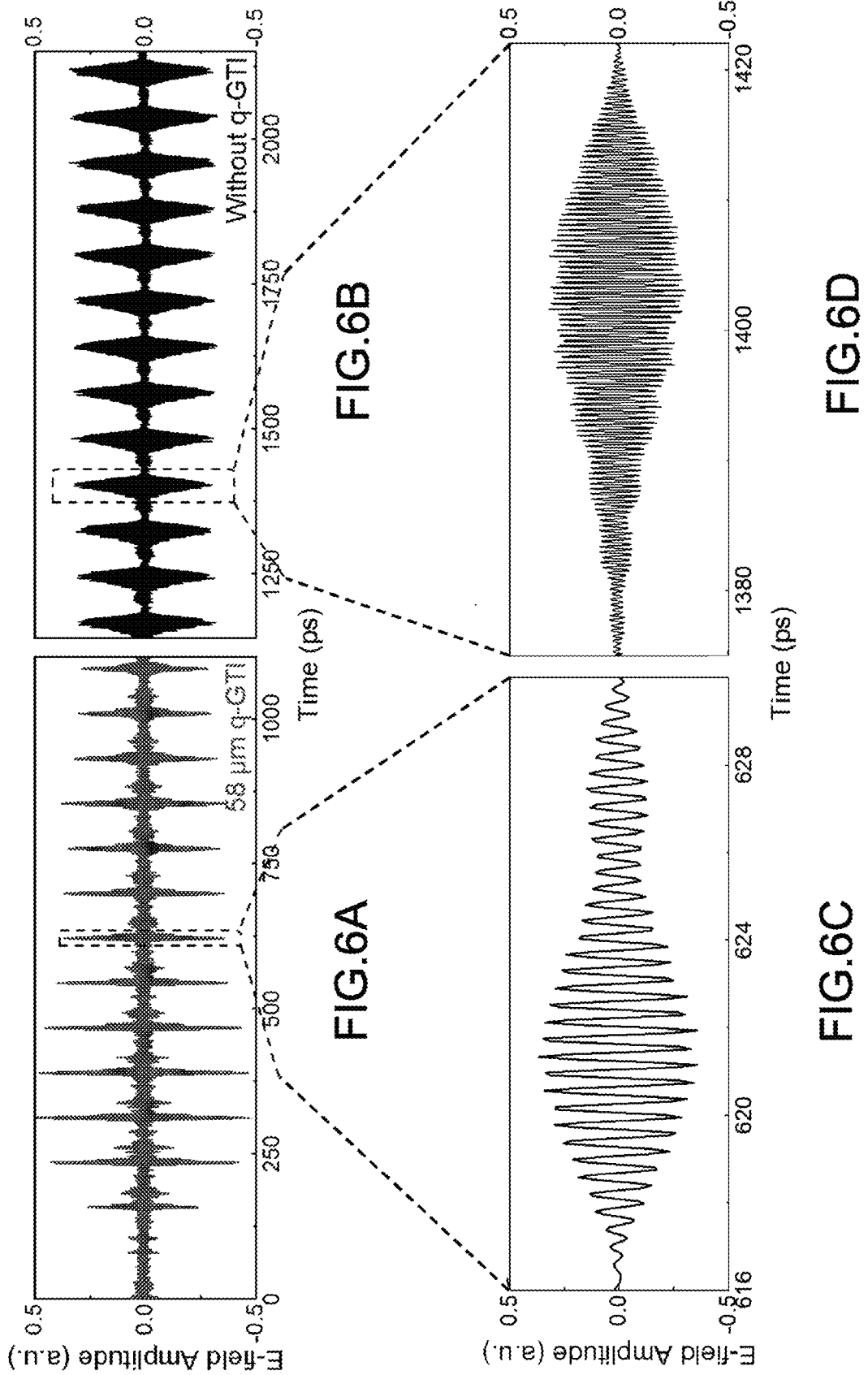

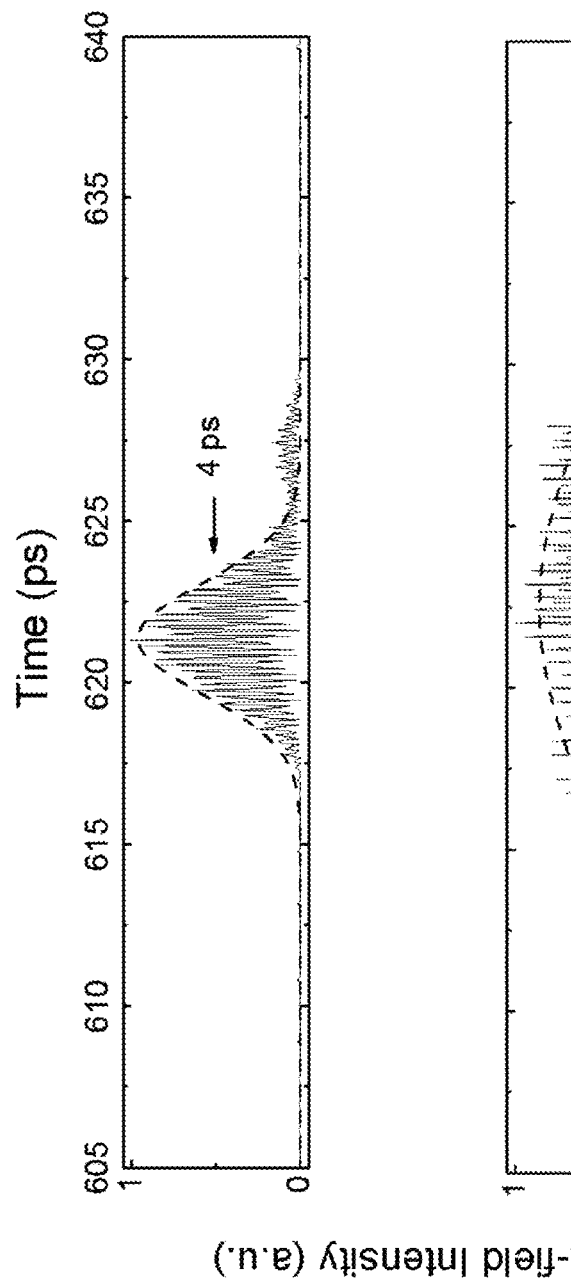

ial patent
LASER SOURCE AND METHOD OF MANUFACTURING SUCH

CROSS-REFERENCE TO RELATED APPLICATIONS

This application is a National Stage of International patent application PCT/IB2017/000763, filed on May 5, 2017, which is based on and claims priority from provisional U.S. patent application having a Ser. No. 62/409,051, filed Oct. 17, 2016, the disclosures of which are incorporated by reference in their entirety.

TECHNICAL FIELD

The present invention relates to a laser source and a method of manufacturing such; more particularly, the present invention relates to a laser source for emitting electromagnetic radiation in the infrared (IR) and Terahertz (THz) domain, i.e. with an emission frequency inferior to 100 THz.

BACKGROUND

When dealing with direct generation of THz radiation, the Group Delay Dispersion (GDD), defined as the derivative of the group delay with respect to angular frequency, is not easy to manage. GDD may be an obstacle to realize some devices, for example, ultrafast lasers. The dispersion indicates that the refractive index varies with frequency; it is undesirable, for example, for short pulse generation. The GDD indicates how a pulse broadens as it propagates within a material with an uncompensated dispersion (a non-zero GDD), and GDD becomes increasingly important for shorter pulses (corresponding to a large emission spectral bandwidth).

The material GDD (i.e the index dispersion related to the material) owing to the bulk material (for example bulk GaAs) is an important factor as a result of the residual absorption from the Reststrahlen band. Further, gain GDD (i.e. GDD related to the gain of the laser) is even greater than the material GDD; gain GDD is due for example to the dispersion added by the intersubband transition and can significantly limit THz frequency comb operation.

Moreover, in contrast to optical and near infrared frequencies, there is a lack of dispersion compensation schemes for THz wavelengths. In fact, there are only a few concepts available to reduce the total GDD. Schemes that have been applied to THz waveguides have used narrow corrugated waveguides to act as a chirped waveguide to show frequency comb operation. (THz dispersion management has also been considered for passive waveguides).

A Gires Tournois interferometer (GTI) is a compensation scheme that has been used in the optical and near infrared domain to compress pulses (see for example Kafaka et al. "*Picosencond and femtosecond pulse generation in a regeneratively mode locked Ti:sapphire laser*" IEEE J. Quatum Electron. 28, 2151-2162 (1992)). A GTI mirror has also been applied to frequency comb generation in mid-infrared laser. As shown in FIG. 1 extracted from Villares et al. ("*Dispersion engineering of quantum cascade laser frequency combs*" Optica 3, 252 (2016), the back facet of a laser is coated with a plurality of layers, the total thickness being on the order of the wavelength and the reflectivities $R_1$ and $R_2$ being adapted to form a GTI. However, for example for the THz domain where the wavelength can be as large as around 100 µm (for a frequency of 3 THz), thick coatings adapted to match the reflectivity conditions are extremely difficult to fabricate.

Here we overcome this limitation and demonstrate a new laser source with a new dispersion compensation scheme, adapted in particular in the THz and infrared domain.

SUMMARY

According to a first aspect, the present disclosure relates to a laser source for emitting radiation in a given emission spectral band, centered on a given emission angular frequency (w), said the central emission angular frequency. The laser source comprises a laser cavity comprising a gain section having a known frequency dependent Group Delay Dispersion (the "Gain GDD"), and a GTI mirror arranged at one end of the gain section, having a known frequency dependent Group Delay Dispersion (the "GTI GDD"). The gain section and the GTI mirror are formed into a same laser medium, said laser medium having a known frequency dependent Group Delay Dispersion (the "Material GDD"), and the gain section and the GTI mirror are separated by a gap of predetermined width filled with a dielectric medium thus forming a two parts laser cavity. Further, the GTI GDD at least partly compensates the sum of the Gain GDD and the material GDD in said emission spectral band.

According one or more embodiments, the compensation of the GDD in said emission spectral band results in a total GDD, equal to the sum of the Material GDD, the Gain GDD and the GTI GDD, comprised between $-0.2\ ps^2$ and $0.2\ ps^2$ in said emission spectral band.

According to one or more embodiments, the total GDD is strictly positive in at least a first sub-band of said emission spectral band and strictly negative in at least a second sub-band of said emission spectral band. Advantageously, said first dub-band and second sub-band are located on either side of the central emission frequency. The applicants have shown that such reparation of the total GDD allows shortening the duration of the pulses emitted by the laser source.

According to one or more embodiments, the central emission angular frequency is inferior to 100 THz, for example comprised between 1 THz and 5 THz.

According to one or more embodiments, the gain section and the GTI are arranged on a same wafer, thus providing a monolithic laser cavity.

This new conception of a laser source, in which the GTI mirror is made in the laser material itself, allows the compensation of the Material GDD and the Gain GDD by the GTI GDD and the generation of short pulses emission in the IR and THz domain. For that purpose, the gain section and the GTI mirror are electrically isolated and optically coupled.

According to one or more embodiments, the GTI mirror is formed by etching the laser medium to provide a gap of predetermined width a filled with a dielectric medium. The laser cavity thus comprises a first part (the gain section), a second part (the GTI mirror) and a gap to separate the two parts.

The dielectric medium may comprise for example air, graphene or any other dielectric medium.

According to one or more embodiments, the width a of the gap is small enough so that the light couples between the two parts of the laser cavity. According to one or more embodiments, the width a of the gap is much smaller than the emission wavelength λ; for example the width a of the gap is smaller than λ/4, i.e. smaller than $\pi c/(2n_d\omega)$ where c is the speed of light in vacuum, $n_d$ is the refractive index of the dielectric medium filling the gap, and $\omega$ is the central emission angular frequency of the laser source.

According to one or more embodiments, the reflectivity $r_1$ of the facet of the GTI mirror facing the gain section, hereafter called the front facet, is comprised between 0.01 and 0.2.

According to one or more embodiments, the reflectivity $r_2$ of the facet of the GTI mirror opposed to the front facet, hereafter called the back facet, is comprised between 0.5 and 1, for example between 0.8 to 1.

The reflectivity $r_1$ of the front facet of the GTI mirror depends on the effective index of the laser medium and/or of the dielectric medium filling the gap and/or the gap width a and/or the central emission angular frequency $\omega$ and/or the length $L_2$ of the GTI mirror.

According to one or more embodiments, the width a of the gap is large enough to achieve a reflectivity $r_1$ of the front facet of the GTI mirror larger than 0.01 (1%).

According to one or more embodiments, the length $L_2$ of the GTI mirror is determined so that the emission spectral band is in a non-resonant frequency sub-band of the GTI GDD. Employing the GTI mirror in a non-resonance angular frequency sub-band of the GTI GDD allows compensating the sum of the Gain GDD and the material GDD in a larger bandwidth.

According to one or more embodiments, the laser cavity is a mode locked cavity. A mode-locked laser cavity allows shorter pulses to be obtained (typically inferior to 20 ps), making it possible to generate a frequency comb.

According to one or more embodiments, the laser cavity is a semiconductor laser, for example a Quantum Cascade Laser (QCL) or an inter-band cascade laser (ICL).

According to one or more embodiments, the laser cavity is arranged between two metal layers, a bottom layer and a top layer, arranged perpendicularly to the growth direction of the laser medium. This configuration is named "double metal cavity" and allows for a better confinement of the light into the laser cavity.

According to one or more embodiments, a part of said metal top layer arranged on the top of the gain section acts as an electrode.

According to a second aspect, the present disclosure relates to a method for manufacturing a laser source for emitting radiation in a given emission spectral band centered on a given emission angular frequency ($\omega$), comprising the steps of:

depositing a laser medium having a known frequency dependent Group Delay Dispersion (the "Material GDD") on a substrate;

separating the laser medium into two parts, a gain section with a known frequency dependent Group Delay Dispersion (the "Gain GDD") and a GTI mirror with a known frequency dependent Group Delay Dispersion (the "GTI GDD"), thus forming a two parts laser cavity, wherein the GTI GDD at least partly compensates the sum of the Gain GDD and the material GDD in said emission spectral band.

According to one or more embodiments, the step of separating the laser medium into two parts comprises the step of etching the laser medium to provide a gap of predetermined width a filled with a dielectric medium, thus forming said gain section the GTI mirror.

BRIEF DESCRIPTION OF THE FIGURES

The present disclosure will now be described in further details by way of non-limiting examples and by reference to the attached figures.

FIGS. 4A and 4B show schematic views of different embodiments of a laser source according to the present disclosure;

FIGS. 6A to 6F show a comparison of the active mod-elocked E-field as function of time, taken with a sampling step of 0.06 ps, for a QCL with a 58 µm GTI (FIG. 6A) according to the present disclosure and a standard QCL cavity (FIG. 6B); a zoom of a single pulse is shown in FIGS. 6C and 6D for both samples to highlight the resolved E-field oscillations (different time scales); FIGS. 6E and 6F show the E-field intensity for both samples with the FWHM calculated by fitting with a Gaussian shape.

DETAILED DESCRIPTION

Specific embodiments of the present invention will now be described in detail with reference to the accompanying figures. In the following detailed description of embodiments of the present invention, numerous specific details are set forth in order to provide a more thorough understanding of the present invention. However, it will be apparent to one of ordinary skill in the art that the present invention may be practiced without these specific details. In other instances, well-known features have not been described in detail to avoid unnecessarily complicating the description.

Herein, the words "comprise/comprising" are synonymous with (means the same thing as) "include/including," "contain/containing", are inclusive or open-ended and do not exclude additional, unrecited elements. Limit values of ranges using for example the words "from", "from . . . to", "bellow", "more than", "greater than", "less than", "lower than", and "at least" are considered included in the ranges.

The present disclosure is based on a new conception of a Gires-Tournois interferometer (GTI). This allows compensating for refractive index dispersion of a laser material permitting the generation of short pulses and frequency combs. It is based on using the laser material itself to realize the GTI. This is in contrast to typical methods that are based on external optical arrangements to the laser medium or the use of thin coatings that are applied on mirrors or on the laser itself.

Figure 1:
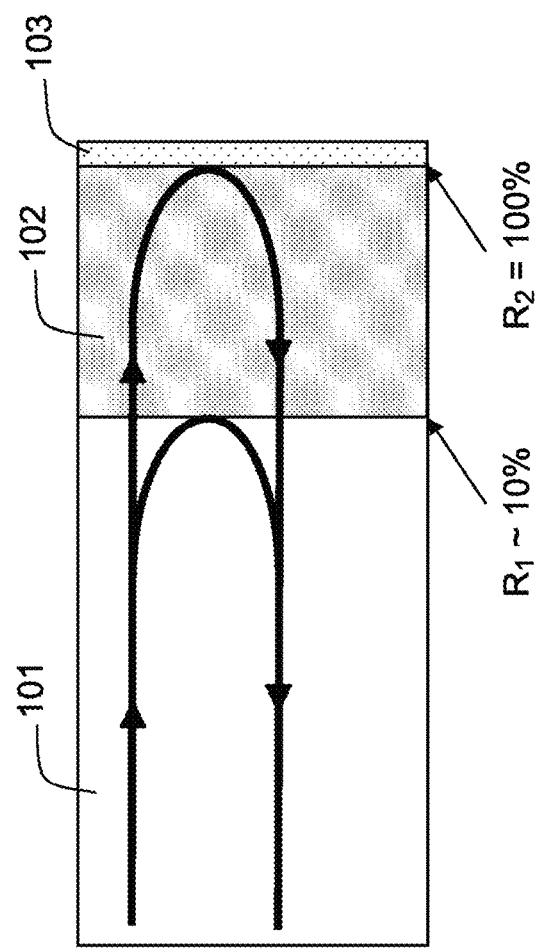
FIG. 1 (already described) shows a mid-infrared laser source according to the prior art.
Figure 2:
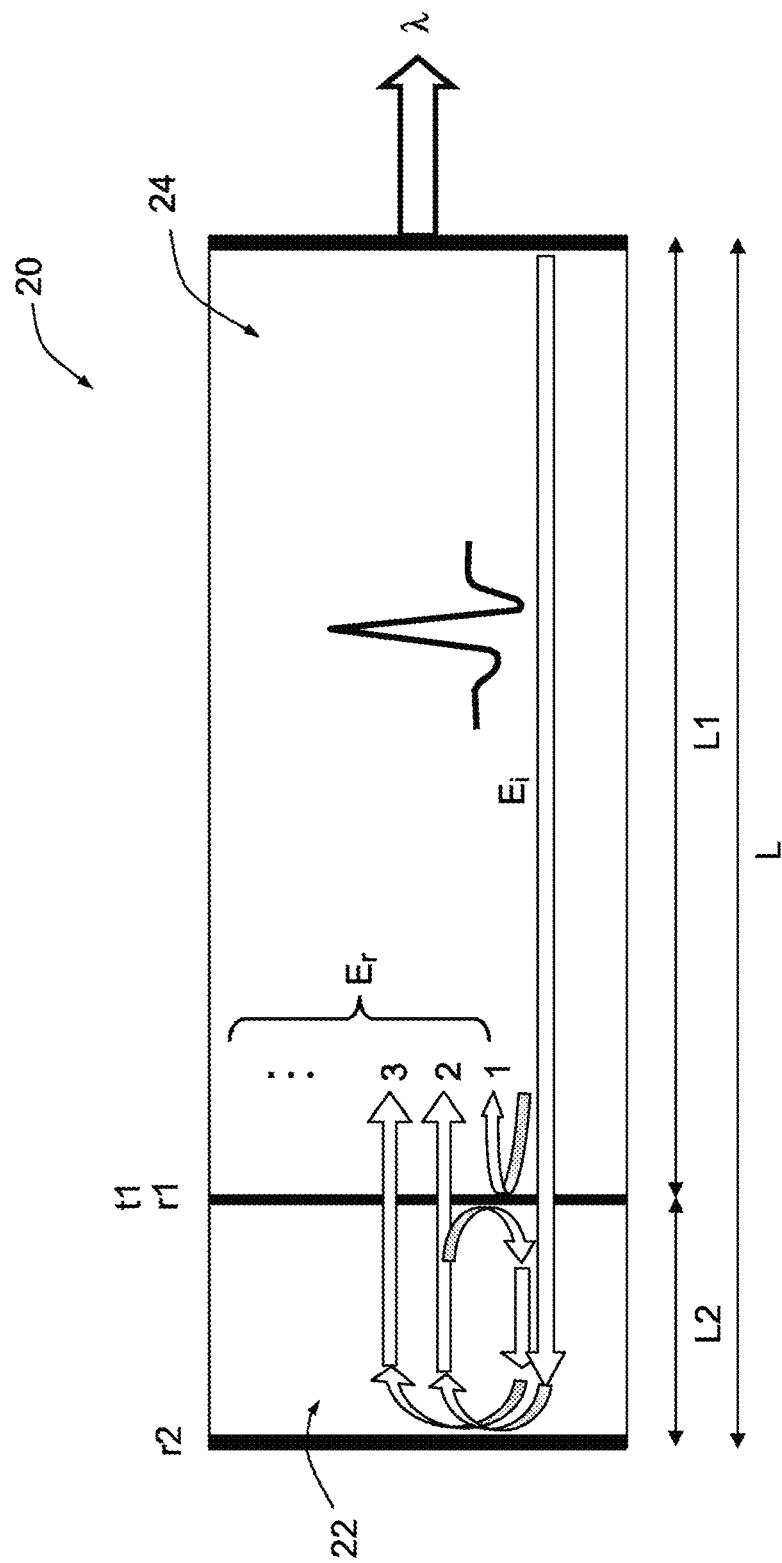
FIG. 2 shows a schematic functional diagram of an example of a laser source according to the present disclosure, wherein said laser source comprises a gain section and a Gires-Tournois Interferometer (GTI) mirror.

FIG. 2 illustrates a schematic functional diagram of an example of a laser source according to the present disclosure. The laser source 20 has a laser cavity with a length L. The laser cavity comprises a gain section 24 with a length $L_1$ and a GTI mirror 22 with a length $L_2$. The GTI mirror is like a small resonator with a length $L_2$. Preferably, the length $L_2$ of the GTI mirror is of the same order as the wavelength emitted by the laser source, i.e. same order as $2\pi c/n\omega$, where n is the refractive index of the GTI mirror medium (which is also the refractive index of the gain section), c is the speed of light in vacuum and $\omega$ is the central emission angular frequency of the laser source.

The GTI mirror comprises a facet facing the gain section, named "front facet", and a facet opposed to the front facet, named "back facet". The GTI mirror operates in reflection where, in the ideal case, the front mirror has a low reflectivity (reflectivity amplitude $r_1 \sim 0.1$) while the back facet has a perfect reflectivity (reflectivity amplitude $r_2 = 1$) as illustrated in FIG. 2. Thus, in the ideal case, the GTI mirror acts as a Fabry-Perot resonator and its Group Delay Dispersion (GDD) is expressed as function of the angular frequency $\omega$ by:

$$GDD_{GTI}(\omega) = -\frac{2\tau^2(1-r_1)\sqrt{r_1}\sin(\omega\tau)}{\left(1+r_1-2\sqrt{r_1}\cos(\omega\tau)\right)^2} \quad (1)$$

where $\tau = 2nL_2/c$ denotes the round trip time of the GTI. By choosing the length $L_2$ of the GTI mirror correctly, compensation of the material and gain dispersion in the gain section can therefore be achieved.

In the real case, the reflection $r_2$ of the back facet is not unity. Thus, the well-established formula (1) needs to be generalized in order to take account of the non-unity reflectivity $r_2$ of the back facet.

Consequently, as illustrated in FIG. 2, if we suppose that the electric field incident onto the GTI mirror is $E_i$ and the total reflected electric field is $E_r$, the total reflection of the GTI mirror $r_{tot}^{GTI}$ can be written as:

$$r_{tot}^{GTI} = E_r/E_i = \quad (2)$$
$$-r_1 + r_2 t_1^2 e^{-2i\delta} + r_1 r_2^2 t_1^2 e^{-4i\delta} + r_1^2 r_2^3 t_1^2 e^{-6i\delta} + \ldots = \frac{r_2 e^{-2i\delta} - r_1}{1 - r_1 r_2 e^{-2i\delta}}$$

where the phase of the electric field in the GTI mirror $\delta$ is equal to $\omega n L_2/c$ and accounts for a single trip in the GTI mirror. In Eq. (2), the signs of the first term ($-r_1$) and the other terms are different, due to the half wave loss of the first reflection "1". The total reflection coefficient $r_{tot}^{GTI}$ of the GTI is a frequency-dependent complex function. This will add a different phase term for different angular frequencies and therefore provides a possibility to compensate the dispersion.

The GDD of the GTI mirror is the second derivative of the spectral phase with respect to the angular frequency and the general expression for the spectral phase of a GTI mirror with a non-unity reflection coefficient can be given by:

$$\Phi_{qGTI}(\omega) = \quad (3)$$
$$\arctan\left(\frac{\text{Im}\{r_{tot}^{qGTI}\}}{\text{Re}\{r_{tot}^{qGTI}\}}\right) = \arctan\left(\frac{r_1^2\sin(\omega\tau) - \sin(\omega\tau)}{r_1/r_2 - r_1^2\cos(\omega\tau) + r_1 r_2 - \cos(\omega\tau)}\right)$$

The effect of $r_1$ being much higher from the ideal case ($r_1 \approx 0.1$) results in more pronounced variations of the GTI GDD near the resonant frequencies but with little effect off-resonance. Thus, employing the GTI mirror in a non-resonance frequency subband of the GTI GDD allows compensating the sum of the Gain GDD and the material GDD in a larger bandwidth. For example, the compensation of the GDD results in a total GDD, equal to the sum of the Material GDD, the Gain GDD and the GTI GDD comprised between $-0.2$ ps$^2$ and $0.2$ ps$^2$ in the emission spectral band.

Figure 3A:
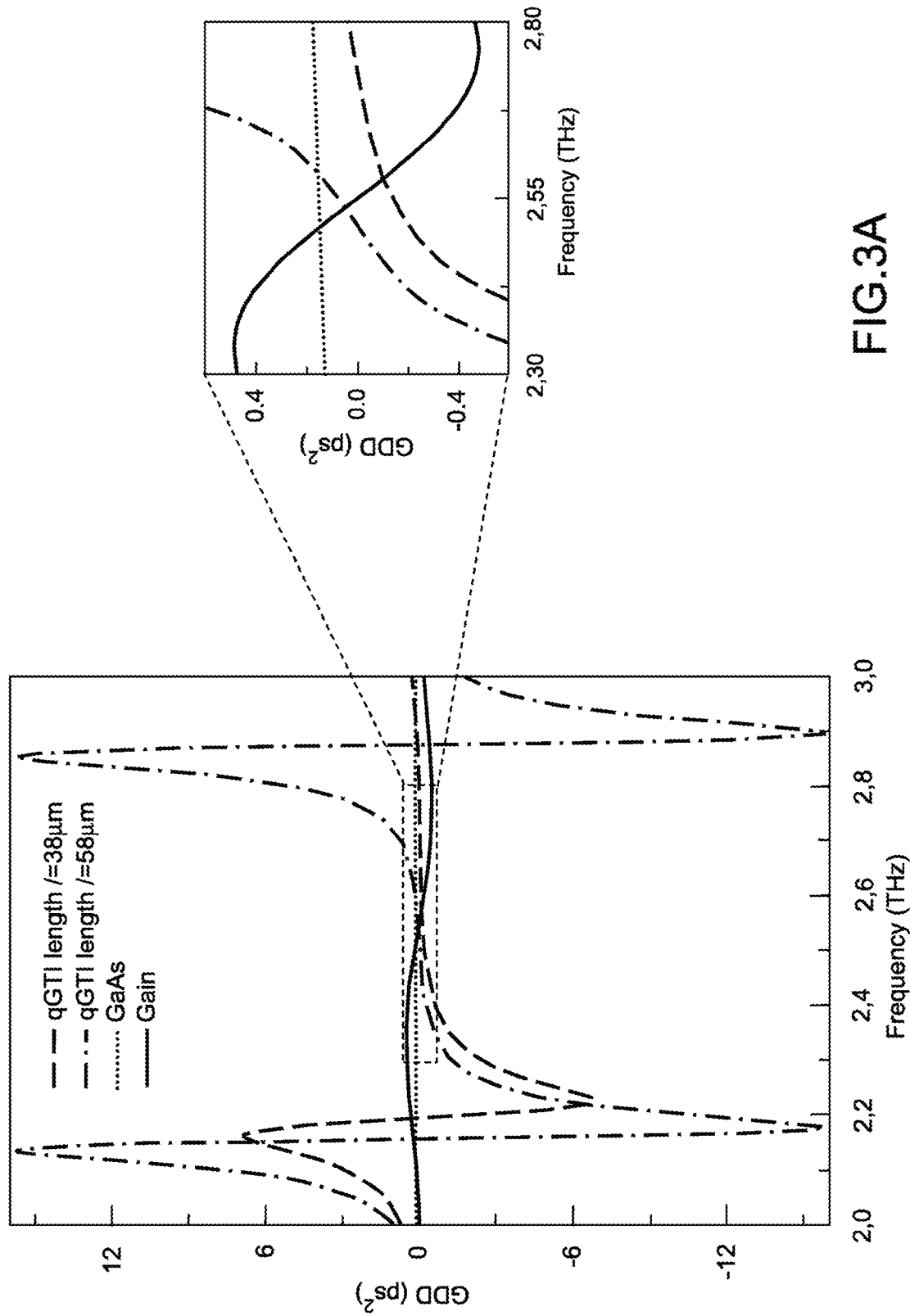
FIG. 3A illustrates curves showing the individual GDD contributions of the GTI, bulk material, i.e. GaAs, and QCL Gain; the GTI GDD is shown for a 58 µm and 38 µm length GTI mirror (total length of the laser cavity)

FIG. 3A shows the calculated individual GDD contributions from the GTI (with 58 μm and 38 μm lengths), the laser material (in this example GaAs), and the gain. The material GDD is obtained from the dispersion relation and the gain GDD is calculated from the Kramers-Kronig relation. The latter is modelled with a gain of 10 cm$^{-1}$ with an angular frequency centred at 2.48 THz, Gaussian full width at half maximum (FWHM) of 600 GHz.

For example, etching a small air gap (~2 μm) into the double metal cavity to realise a small cavity at the end of the QCL, results in a GTI mirror with a contrast in the reflectivities of the front ($r_1$) and back ($r_2$) facet. The reflectivities of the facet and the air gap were calculated from the finite-difference-time-domain method using the Meep software package by N. Jukam at the University of Bochum. From these simulations, the GTI mirror realized in this work provides a front facet reflectivity of $r_1 = 0.61$ and a back facet reflectivity of $r_2 = 0.83$ and thus different from the ideal case of $r_1 = 0.1$ and $r_2 = 1$. (The high value of $r_2$ is a result of the strong confinement of the Double Metal waveguide mode).

As shown in FIG. 3A, the gain GDD provides a zero-crossing at its central emission angular frequency and clearly dominates over the positive GaAs material GDD. As depicted in FIG. 3A, the GDD of the 58 μm GTI is mostly negative below the centre-frequency of the gain (at 2.48 THz) and positive above it, opposite to the gain GDD. In contrast, a 38 μm GTI only provides negative GDD in the investigated region. The GTI is employed 'off resonance' in this example, that is between the resonance angular frequencies at ~2.25 THz and ~2.75 THz of the 58 μm GTI as shown in the dashed box.

Figure 3B:
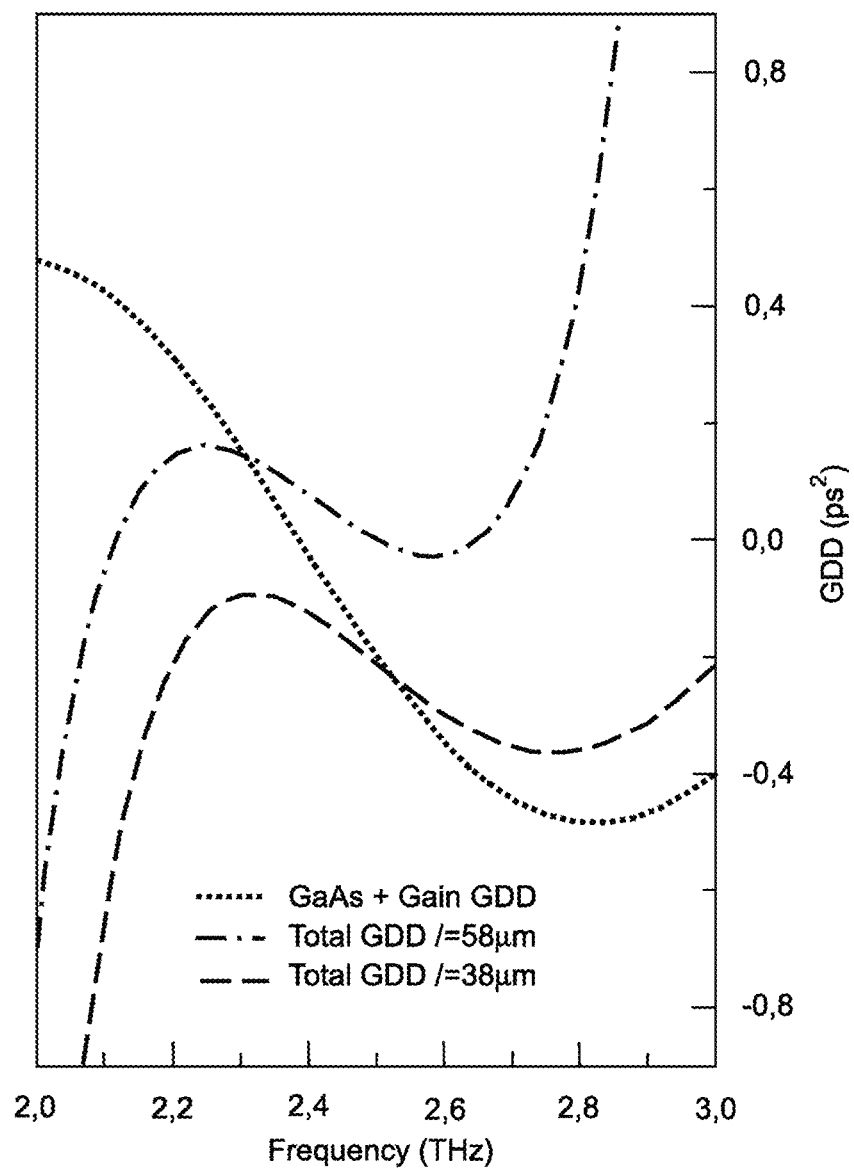
FIG. 3B shows the total GDD for a 58 µm and 38 µm length GTI mirror (total length of the laser cavity 3.2 mm); the contribution of the Gain GDD and Material GDD is also shown for comparison.

FIG. 3B shows the gain and the material GDD compared to the total GDD (sum of material, gain and GTI GDD) with the GTI QCLs. Remarkably, the total GDD is approximately flat in the region from 2.4 to 2.7 THz for the 58 μm GTI (around zero GDD), while it is entirely negative for the 38 μm GTI.

The applicant shows that a GTI with non-ideal reflectivities can be realised using the gain medium itself, such as the QCL material itself. By designing the correct length of the GTI (58 μm for emission around 2.5 THz), the GTI can be used to compensate the dispersion induced by the gain profile and the material, and hence realise short pulses when mode locked. A broad bandwidth of the GDD compensation is achieved by exploiting both the positive and the negative GDD regime of the GTI, thus compensating positive and negative gain GDD simultaneously.

FIGS. 4A and 4B show different embodiments of a laser source according the present disclosure.

In the embodiments shown in FIGS. 4A-4B, the laser source 30 comprises a laser cavity adapted for emitting radiation in an emission spectral band centered on a given emission angular frequency $\omega$ (emission wavelength $\lambda$). The laser cavity comprises a total length L and height h. As shown in FIGS. 4A and 4B, the laser cavity is in two parts, comprising a gain section 31 and a GTI mirror 32 arranged at one end of the gain section. The gain section and the GTI mirror are formed into a same laser medium, thus forming a two parts laser cavity. The laser medium may be a quantum cascade laser (QCL) or an inter-band cascade laser.

As shown in FIGS. 4A-4B, the gain section and the GTI mirror are electrically isolated and optically coupled.

In these embodiments, the laser cavity is arranged between two metal layers 34, 35, a bottom metal layer and a top metal layer, arranged perpendicularly to the growth direction of the laser medium. thus forming a "double metal cavity". Such double metal cavity allows for a better confinement of the light into the laser cavity.

As shown in FIGS. 4A-4B, the metal layers may further be used as electrodes when the laser source needs to be electrically alimented (electrical source 36).

According to one embodiment shown in FIGS. 4A and 4B, the laser medium is etched, thus forming a gap 33 that separates the two parts 32, 31 of the laser cavity. The gap of predetermined width a may be filled with a dielectric medium 33' as shown in FIG. 4B or filled with air (FIG. 4A). The dielectric medium (FIG. 4B) may be for example graphene or any other dielectric material.

Figure 5A:
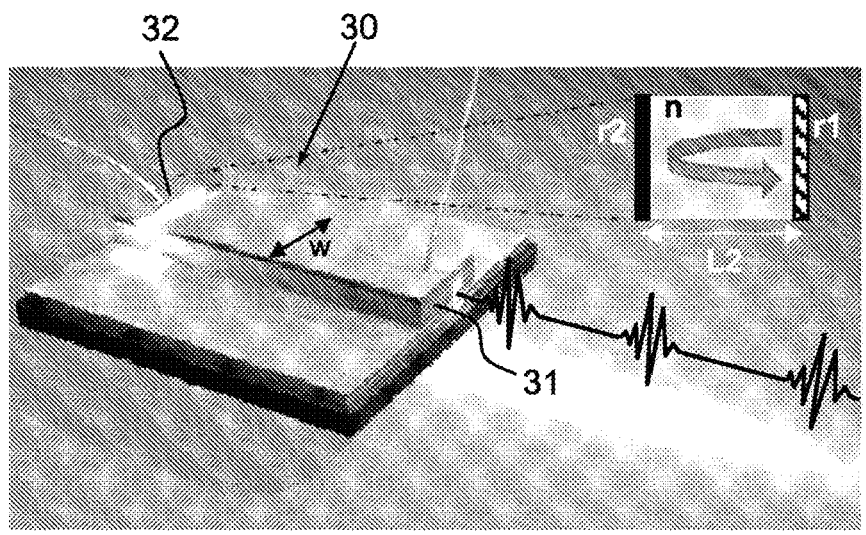
FIG. 5A is a 3D scheme illustrating a laser source according an embodiment of the present disclosure, in which the gain section is a QCL; the inset shown in FIG. 5A represents the GTI mirror with asymmetric reflectivities, $r_1$ and $r_2$, and a cavity length $L_2$.
Figures 5B, 5C:
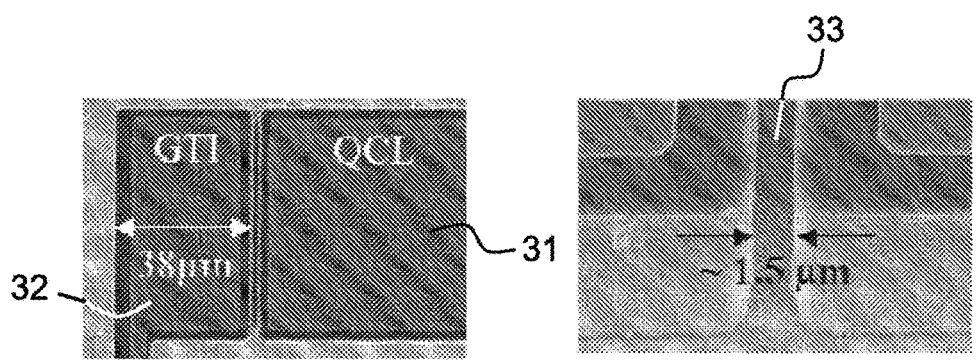
FIGS. 5B, 5C and 5D show images obtained by scanning electron microscopy (SEM) respectively of a GTI mirror coupled to a QCL, a gap between the GTI mirror and the QCL, and a wafer equipped with two laser sources according to the present disclosure.
Figure 5D:
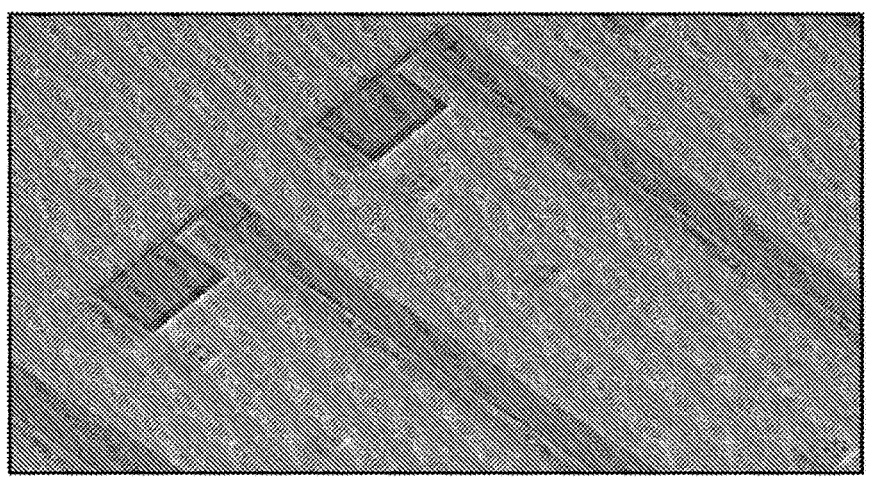

FIG. 5A is a schema of another example of a laser source 30 according to the present disclosure, and FIGS. 5B, 5C and 5D show images of an experimental laser source 30 according to the present disclosure. Specifically, FIG. 5A is a 3D scheme illustrating a laser source according an embodiment of the present disclosure, in which the gain section is a QCL and the GTI mirror 32 is obtained by etching the laser medium to form a gap of predetermined length; the inset shown in FIG. 5A represents the GTI mirror with asymmetric reflectivities, $r_1$ and $r_2$, and a cavity length $L_2$; FIGS. 5B, 5C and 5D show images obtained by scanning electron microscopy (SEM) respectively of a GTI mirror (38 µm length) coupled to a QCL, a 1.5 µm gap between the GTI mirror and the QCL, and a wafer equipped with two laser sources according to the present disclosure.

By designing the length of the integrated GTI mirror as it was previously explained and exploiting the high reflectivity of the double metal cavity QCL, significant compensation of the QCL's inherent GDD can be realized.

A laser source as shown in FIGS. 5A-5D can be made the following manner. A gain section such as a QCL with a centre lasing angular frequency designed to be ~2.5 THz with a large emission bandwidth close to 0.5 THz may be used, based on a modified LO phonon depopulation active region operating at 2.7 THz (details in method section). The wafer may be processed into double metal cavity using standard lithography with the ridge defined using Inductively coupled plasma (ICP) etching for a vertical ridge profile. The GTI mirror may be realized in the same processing step by etching through the active region at one end of the QCL ridge to realise short cavity lengths α of 58 µm and 38 µm, separated from the main QCL ridge by a small subwavelength (~1.5 µm) air gap (see FIG. 5B and FIG. 5C). The ridge width W for both devices was 68 µm and the total length of the laser cavity L was ~3.2 mm. What is the "ridge width"? Please keep only the details useful to determine the hypothesis of the calculated curves.

According one embodiment of the present description, the laser cavity is a mode locked cavity. A microwave modulation close to the round-trip angular frequency may be used to actively mode lock the laser source such that short pulses are generated i.e. to fix the angular frequency spacing and the phase of each mode. (Further details are available in the methods section).

Thus, this dispersion compensation scheme, monolithically integrated into the laser cavity, allow the pulse duration to be greatly shortened.

This directly results in pulse durations as shorts as 4 ps, from 16 ps with a standard QCL geometry, with a continuous Gaussian spectral range extending from 2.3 to 2.9 THz. The dispersive effect of the GTI mirror is clearly demonstrated by characterizing a GTI of a length that results in zero dispersion compared with one that introduces too much dispersion. The former shows a stable ultra-short pulse train while the latter destroys the pulse formation.

For example, the same approach is applied to a 3.25 THz QCL to demonstrate the generality of the technique. A 5 ps pulse duration is generated whose angular frequency emission ranges from 3.1 THz to 3.4 THz. This new and relatively simple approach can be easily scaled to compensate for even greater spectral bandwidth and potentially attain sub-picosecond pulse widths, opening up these sources to frequency comb spectroscopy controlled by microwave references.

Thus, the passive mode-locking obtained with the laser source as described in the present disclosure allows breaking the pulse limitations set by active mode-locking and deeply modulating the gain loss (gain) of laser for ultrashort THz pulse generation.

For example of an active mode locking, the microwave power may be set to 30 dBm. The microwave modulation frequency that resulted in the clearest pulses is 12.62 GHz and 12.88 GHz for the standard and GTI QCL samples, respectively. It is important to note that for the standard QCL, the modulation applied is considerably different to the free spectral range. In FIG. 6, the electric field emission as a function of time of the 58 µm GTI QCL (FIG. 6A) and the standard QCL (FIG. 6B) are compared. (The 58 µm GTI mirror is designed to provide negative and positive dispersion compensation of the THz QCL emission as shown in FIG. 3). As it can be clearly seen, after an initial amplification stage (t<500 ps), stable pulses are formed and the insertion of a dispersion compensation permits the pulse duration of the laser source according the present disclosure to be greatly reduced compared to the standard laser.

FIGS. 6C and 6D shows a zoom of one pulse for the GTI QCL and standard QCL, respectively, highlighting strongly the difference between the two cases, with considerably fewer electric field oscillations for the former. To extract the FWHM of the pulse duration, a Gaussian fit is used to approximate the pulse shape intensity as shown in the dashed line in FIGS. 6E and 6F.

This experimental results show a dispersion compensation scheme, monolithically integrated into the THz QCL waveguide, can be successfully engineered to greatly shorten the pulse duration of THz QCLs when active mode locked. It is based on an adapted GTI concept where a small resonator possesses non-equal cavity mirror reflectivities, permitting control of the total dispersion. For an integrated GTI, the high facet reflectivity of a QCL embedded in a MM waveguide is used as the back end mirror for the THz pulse while the low reflectivity mirror is realized by etching a sub-wavelength air gap directly in the waveguide. By designing the GTI's length to compensate the QCL emission around its central angular frequency, pulse durations as short as 4 ps can be formed. This technique of on-chip dispersion overcomes previous bottlenecks to realize short pulses from THz QCLs and has the potential to compensate even greater bandwidths, permitting the sub-picosecond regime to be attained. Such short pulses would be of interest for high peak power THz sources, replacing Ti:Sapphire lasers for short THz pulse generation, and dual frequency comb spectroscopy where the mode spacing can be precisely controlled with stable microwave generators.

The pulse characterization of the THz quantum cascade laser (QCL) may be based on coherent sampling of the electric-field (E-field) using electro-optic detection. This technique requires to phase lock the emission of the THz QCL to a THz pulse, which in turn is locked to the repetition rate of a femtosecond laser. To fulfil this requirement, an established ultrafast injection seeding technique may be employed. A broad-band THz pulse (seed) with a fixed phase is generated using a photoconductive switch excited by a 100 fs near-infrared pulse from a Ti:Sa laser. The THz seed pulse is injected into one end cavity of the QCL waveguide prior to gain switching the QCL with an electrical radio frequency (RF) pulse with a duration of a few nanoseconds. This allows the THz input pulse to be amplified and eventually seed the QCL emission, instead of being initiated by the QCL's inherent spontaneous emission. Finally, a purge box with dry air is used to prevent absorption of the THz emission by atmospheric water.

To initiate the mode-locking regime, a microwave modulation of the QCL bias may be applied close to the THz cavity round-trip frequency. The gain is modulated close to the QCL threshold. The microwave modulation is generated from the photo-excitation of an ultrafast photodiode by a pick-off beam of the Ti:Sa laser. The generated electrical signal consists of a comb of angular frequencies extending to ~20 GHz separated by the Ti:Sapphire repetition rate (76 MHz). A yttrium iron garnet bandpass filter is used to pick out a harmonic of the reference laser repetition rate close to the QCL cavity round-trip frequency, which is then amplified by a set of microwave power amplifiers. The proper synchronization of the THz seed pulse with the modulated QCL bias allows the detection of the QCL E-field as function of the time via electro optic sampling.

The devices and methods as described above comprise different variants, modifications and enhancements which will be obviously apparent to the person skilled in the art, it being understood that these different variants, modifications and enhancements form part of the scope of the invention, such as defined by the claims which follow.

The invention claimed is:

1. A laser source for emitting radiation in a given emission spectral band, centered on a given emission angular frequency, comprising:
a laser cavity comprising a gain section having a known frequency dependent Group Delay Dispersion (GDD), being a Gain GDD, and a Gires Tournois interferometer (GTI) mirror arranged at one end of the gain section, and having a known frequency dependent Group Delay Dispersion, being a GTI GDD, wherein:
the gain section and the GTI mirror are formed into a same laser medium, said laser medium having a known frequency dependent Group Delay Dispersion, being a Material GDD, thus forming a two parts laser cavity;
the gain section and the GTI mirror are separated by a gap of predetermined width (a) filled with a dielectric medium; and
the GTI GDD at least partly compensates a sum of the Gain GDD and the Material GDD in said emission spectral band.

2. The laser source according to claim 1, wherein the dielectric medium comprises graphene.

3. The laser source according to claim 1, wherein the dielectric medium is air.

4. The laser source according to claim 1, wherein the width (a) of the gap is smaller than $nc/(nd2w)$ where nd is the refractive index of the dielectric medium and c is the speed of light in vacuum.

5. The laser source according to claim 1, wherein the length ($L_2$) of the GTI mirror is determined so that the central emission angular frequency is in a non-resonant frequency sub-band of the GTI GDD.

6. The laser source according to claim 1, wherein the laser cavity is a mode locked cavity.

7. The laser source according to claim 1, wherein the gain section is a Quantum Cascade Laser.

8. The laser source according to claim 1, wherein the laser medium is arranged between two metal layers, a bottom metal layer and a top metal layer, arranged perpendicularly to the growth direction of the laser medium, thus forming a double metal cavity.

9. The laser source according to claim 1, wherein the central emission angular frequency is comprised between 1 THz and 5 THz.

10. A method for manufacturing a laser source for emitting radiation in a given emission spectral band centered on a given emission angular frequency, comprising the steps of:
depositing a laser medium having a known angular frequency dependent Group Delay Dispersion (GDD), being a Material GDD, on a substrate;
separating the laser medium into two parts, a gain section with a known frequency dependent Group Delay Dispersion, being a Gain GDD, and a GTI mirror with a known frequency dependent Group Delay Dispersionm, being a GTI GDD, thus forming a two parts laser cavity, wherein the GTI GDD compensates a sum of the Gain GDD and the Material GDD in said emission spectral band.

11. The method according to claim 10, wherein the step of separating the laser medium into two parts comprises:
etching the laser medium to provide a gap of predetermined width (a) filled with a dielectric medium, thus forming said gain section and the GTI mirror.

* * * * *